United States Patent
Judkins, III et al.

(10) Patent No.: US 11,770,632 B2
(45) Date of Patent: Sep. 26, 2023

(54) DETERMINING A TEMPERATURE OF A PIXEL ARRAY BY MEASURING VOLTAGE OF A PIXEL

(71) Applicant: Allegro MicroSystems, LLC, Manchester, NH (US)

(72) Inventors: Joseph James Judkins, III, Sugar Land, TX (US); Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 45 days.

(21) Appl. No.: 17/230,253

(22) Filed: Apr. 14, 2021

(65) Prior Publication Data

US 2022/0337770 A1 Oct. 20, 2022

(51) Int. Cl.
*H04N 25/709* (2023.01)
*G01K 7/01* (2006.01)
*H04N 17/00* (2006.01)

(52) U.S. Cl.
CPC .............. *H04N 25/709* (2023.01); *G01K 7/01* (2013.01); *H04N 17/002* (2013.01)

(58) Field of Classification Search
CPC ................ H04N 5/3698; H04N 17/00; H04N 5/335–379; H04N 25/63; H04N 25/75; H04N 25/77; H04N 17/002; H04N 23/10; H04N 23/72; H04N 23/81; H04N 25/621; H04N 25/65; H04N 25/709; G01K 7/01; G01K 7/00; G01K 7/16; G01K 7/18; G01K 7/183; G01K 7/186; G01K 7/22; G01K 7/223; G01K 7/24; G01K 7/226; G01K 7/30; G01K 7/34; G01K 2217/00; H01L 27/14601
See application file for complete search history.

(56) References Cited

U.S. PATENT DOCUMENTS

| | | | |
|---|---|---|---|
| 4,785,191 A | * | 11/1988 | Ondris ................ H04N 5/3692 348/E3.027 |
| 6,760,145 B1 | | 7/2004 | Taylor et al. |
| 6,778,728 B2 | | 8/2004 | Taylor et al. |
| 6,894,823 B2 | | 5/2005 | Taylor et al. |
| 6,989,921 B2 | | 1/2006 | Bernstein et al. |
| 7,015,780 B2 | | 3/2006 | Bernstein et al. |

(Continued)

FOREIGN PATENT DOCUMENTS

| | | |
|---|---|---|
| DE | 19936441 A1 | 3/2001 |
| TW | 201422772 | 6/2014 |

OTHER PUBLICATIONS

PCT International Search Report and Written Opinion dated May 24, 2022 for International Application No. PCT/US2022/017405; 13 Pages.

(Continued)

*Primary Examiner* — Michael E Teitelbaum
*Assistant Examiner* — Humam M Satti
(74) *Attorney, Agent, or Firm* — DALY CROWLEY MOFFORD & DURKEE, LLP

(57) ABSTRACT

Methods and apparatus for determining the temperature of a pixel array. In embodiments, a first pixel in a pixel array is reverse-biased and a second pixel in the pixel array is forward-biased. A voltage for the second pixel can be measured to determine a temperature of the pixel array from the measured voltage for the second pixel.

16 Claims, 6 Drawing Sheets

(56) References Cited

U.S. PATENT DOCUMENTS

| | | | |
|---|---|---|---|
| 7,160,753 B2 | 1/2007 | Williams, Jr. |
| 7,432,537 B1 | 10/2008 | Huntington |
| 7,504,053 B1 | 3/2009 | Alekel |
| 7,764,719 B2 | 7/2010 | Munroe et al. |
| 7,782,911 B2 | 8/2010 | Munroe et al. |
| 7,852,549 B2 | 12/2010 | Alekel et al. |
| 7,885,298 B2 | 2/2011 | Munroe |
| 7,994,421 B2 | 8/2011 | Williams et al. |
| 8,207,484 B1 | 6/2012 | Williams |
| 8,319,307 B1 | 11/2012 | Williams |
| 8,570,372 B2 | 10/2013 | Russell |
| 8,597,544 B2 | 12/2013 | Alekel |
| 8,630,036 B2 | 1/2014 | Munroe |
| 8,630,320 B2 | 1/2014 | Munroe et al. |
| 8,730,564 B2 | 5/2014 | Alekel |
| 8,743,453 B2 | 6/2014 | Alekel et al. |
| 8,760,499 B2 | 6/2014 | Russell |
| 8,766,682 B2 | 7/2014 | Williams |
| 8,853,639 B2 | 10/2014 | Williams, Jr. |
| 9,121,762 B2 | 9/2015 | Williams et al. |
| 9,197,233 B2 | 11/2015 | Gaalema et al. |
| 9,269,845 B2 | 2/2016 | Williams et al. |
| 9,368,933 B1 | 6/2016 | Nijjar et al. |
| 9,389,060 B2 | 7/2016 | Romero et al. |
| 9,397,469 B1 | 7/2016 | Nijjar et al. |
| 9,447,299 B2 | 9/2016 | Schut et al. |
| 9,451,554 B1 | 9/2016 | Singh et al. |
| 9,466,745 B2 | 10/2016 | Williams et al. |
| 9,529,079 B1 * | 12/2016 | Droz ................... G01S 7/484 |
| 9,553,216 B2 | 1/2017 | Williams et al. |
| 9,591,238 B2 | 3/2017 | Lee et al. |
| 9,693,035 B2 | 6/2017 | Williams et al. |
| 9,759,602 B2 | 9/2017 | Williams |
| 9,804,264 B2 | 10/2017 | Villeneuve et al. |
| 9,810,775 B1 | 11/2017 | Welford et al. |
| 9,810,777 B2 | 11/2017 | Williams et al. |
| 9,810,786 B1 | 11/2017 | Welford et al. |
| 9,812,838 B2 | 11/2017 | Villeneuve et al. |
| 9,823,353 B2 | 11/2017 | Eichenholz et al. |
| 9,835,490 B2 | 12/2017 | Williams et al. |
| 9,841,495 B2 | 12/2017 | Campbell et al. |
| 9,843,157 B2 | 12/2017 | Williams |
| 9,847,441 B2 | 12/2017 | Huntington |
| 9,857,468 B1 | 1/2018 | Eichenholz et al. |
| 9,869,754 B1 | 1/2018 | Campbell et al. |
| 9,874,635 B1 | 1/2018 | Eichenholz et al. |
| 9,897,687 B1 | 2/2018 | Campbell et al. |
| 9,905,992 B1 | 2/2018 | Welford et al. |
| 9,923,331 B2 | 3/2018 | Williams |
| 9,941,433 B2 | 4/2018 | Williams et al. |
| 9,958,545 B2 | 5/2018 | Eichenholz et al. |
| 9,989,629 B1 | 6/2018 | LaChapelle |
| 9,995,622 B2 | 6/2018 | Williams |
| 10,003,168 B1 | 6/2018 | Villeneuve |
| 10,007,001 B1 | 6/2018 | LaChapelle et al. |
| 10,012,732 B2 | 7/2018 | Eichenholz et al. |
| 10,061,019 B1 | 8/2018 | Campbell et al. |
| 10,088,559 B1 | 10/2018 | Weed et al. |
| 10,094,925 B1 | 10/2018 | LaChapelle |
| 10,114,111 B2 | 10/2018 | Russell et al. |
| 10,121,813 B2 | 11/2018 | Eichenholz et al. |
| 10,139,478 B2 | 11/2018 | Gaalema et al. |
| 10,169,678 B1 | 1/2019 | Sachdeva et al. |
| 10,169,680 B1 | 1/2019 | Sachdeva et al. |
| 10,175,345 B2 | 1/2019 | Rhee et al. |
| 10,175,697 B1 | 1/2019 | Sachdeva et al. |
| 10,191,155 B2 | 1/2019 | Curatu |
| 10,209,359 B2 | 2/2019 | Russell et al. |
| 10,209,732 B2 | 2/2019 | Cook |
| 10,211,592 B1 | 2/2019 | Villeneuve et al. |
| 10,211,593 B1 | 2/2019 | Lingvay et al. |
| 10,217,889 B2 | 2/2019 | Dhulla et al. |
| 10,218,144 B2 | 2/2019 | Munroe et al. |
| 10,241,198 B2 | 3/2019 | LaChapelle et al. |
| 10,254,388 B2 | 4/2019 | LaChapelle et al. |
| 10,254,762 B2 | 4/2019 | McWhirter et al. |
| 10,267,898 B2 | 4/2019 | Campbell et al. |
| 10,267,899 B2 | 4/2019 | Weed et al. |
| 10,267,918 B2 | 4/2019 | LaChapelle et al. |
| 10,275,689 B1 | 4/2019 | Sachdeva et al. |
| 10,295,668 B2 | 5/2019 | LaChapelle et al. |
| 10,310,058 B1 | 6/2019 | Campbell et al. |
| 10,324,170 B1 | 6/2019 | Engberg, Jr. et al. |
| 10,324,185 B2 | 6/2019 | McWhirter et al. |
| 10,338,199 B1 | 7/2019 | McWhirter et al. |
| 10,338,223 B1 | 7/2019 | Englard et al. |
| 10,340,651 B1 | 7/2019 | Drummer et al. |
| 10,345,437 B1 | 7/2019 | Russell et al. |
| 10,345,447 B1 | 7/2019 | Hicks |
| 10,348,051 B1 | 7/2019 | Shah et al. |
| 10,386,489 B2 | 8/2019 | Albelo et al. |
| 10,394,243 B1 | 8/2019 | Ramezani et al. |
| 10,401,480 B1 | 9/2019 | Gaalema et al. |
| 10,401,481 B2 | 9/2019 | Campbell et al. |
| 10,418,776 B2 | 9/2019 | Welford et al. |
| 10,445,599 B1 | 10/2019 | Hicks |
| 10,451,716 B2 | 10/2019 | Hughes et al. |
| 10,473,788 B2 | 11/2019 | Englard et al. |
| 10,481,605 B1 | 11/2019 | Maila et al. |
| 10,488,496 B2 | 11/2019 | Campbell et al. |
| 10,491,885 B1 | 11/2019 | Hicks |
| 10,502,831 B2 | 12/2019 | Eichenholz |
| 10,503,172 B2 | 12/2019 | Englard et al. |
| 10,509,127 B2 | 12/2019 | Englard et al. |
| 10,514,462 B2 | 12/2019 | Englard et al. |
| 10,520,602 B2 | 12/2019 | Villeneuve et al. |
| 10,523,884 B2 | 12/2019 | Lee et al. |
| 10,535,191 B2 | 1/2020 | Sachdeva et al. |
| 10,539,665 B1 | 1/2020 | Danziger et al. |
| 10,545,240 B2 | 1/2020 | Campbell et al. |
| 10,551,485 B1 | 2/2020 | Maheshwari et al. |
| 10,551,501 B1 | 2/2020 | LaChapelle |
| 10,557,939 B2 | 2/2020 | Campbell et al. |
| 10,557,940 B2 | 2/2020 | Eichenholz et al. |
| 10,571,567 B2 | 2/2020 | Campbell et al. |
| 10,571,570 B1 | 2/2020 | Paulsen et al. |
| 10,578,720 B2 | 3/2020 | Hughes et al. |
| 10,591,600 B2 | 3/2020 | Villeneuve et al. |
| 10,591,601 B2 | 3/2020 | Hicks et al. |
| 10,606,270 B2 | 3/2020 | Englard et al. |
| 10,627,495 B2 | 4/2020 | Gaalema et al. |
| 10,627,512 B1 | 4/2020 | Hicks |
| 10,627,516 B2 | 4/2020 | Eichenholz |
| 10,627,521 B2 | 4/2020 | Englard et al. |
| 10,636,285 B2 | 4/2020 | Haas et al. |
| 10,641,874 B2 | 5/2020 | Campbell et al. |
| 10,663,564 B2 | 5/2020 | LaChapelle |
| 10,663,585 B2 | 5/2020 | McWhirter |
| 10,677,897 B2 | 6/2020 | LaChapelle et al. |
| 10,677,900 B2 | 6/2020 | Russell et al. |
| 10,684,360 B2 | 6/2020 | Campbell |
| 2004/0052299 A1 * | 3/2004 | Jay ................... G01M 11/335 374/1 |
| 2010/0038520 A1 | 2/2010 | Yenisch et al. |
| 2014/0293265 A1 | 10/2014 | Stettner et al. |
| 2018/0069367 A1 | 3/2018 | Villeneuve et al. |
| 2018/0284239 A1 | 10/2018 | LaChapelle et al. |
| 2018/0284240 A1 | 10/2018 | LaChapelle et al. |
| 2018/0284275 A1 | 10/2018 | LaChapelle |
| 2018/0284280 A1 | 10/2018 | Eichenholz et al. |
| 2019/0124286 A1 * | 4/2019 | Huang ................ H01L 27/1463 |
| 2019/0242995 A1 | 8/2019 | Dort et al. |
| 2019/0310368 A1 | 10/2019 | LaChapelle |
| 2020/0284883 A1 | 9/2020 | Ferreira et al. |
| 2020/0341126 A1 | 10/2020 | Yates et al. |
| 2021/0098512 A1 * | 4/2021 | Kaklin ................. H01L 27/142 |
| 2022/0163401 A1 * | 5/2022 | Herceg ................ G01K 7/01 |
| 2022/0182563 A1 * | 6/2022 | Mun ................. H01L 27/14643 |

OTHER PUBLICATIONS

U.S. Appl. No. 17/199,790, filed Mar. 12, 2021, Stary et al.
U.S. Appl. No. 17/566,763, filed Dec. 31, 2021, Huntington et al.

(56) References Cited

OTHER PUBLICATIONS

U.S. Appl. No. 17/648,702, filed Jan. 24, 2022, Lee et al.
U.S. Appl. No. 17/651,250, filed Feb. 16, 2022, Marshall.
U.S. Appl. No. 17/653,881, filed Mar. 8, 2022, Keuleyan et al.
U.S. Appl. No. 17/656,977, filed Mar. 29, 2022, Myers et al.
U.S. Appl. No. 17/656,978, filed Mar. 29, 2022, Myers et al.
U.S. Appl. No. 17/656,981, filed Mar. 29, 2022, Myers et al.
U.S. Appl. No. 17/197,314, filed Mar. 10, 2021, Taylor et al.
U.S. Appl. No. 17/197,328, filed Mar. 30, 2021, Taylor et al.
U.S. Appl. No. 17/230,276, filed Apr. 14, 2021, Cadugan.
U.S. Appl. No. 17/230,277, filed Apr. 14, 2021, Judkins, III et al.
U.S. Appl. No. 17/352,829, filed Jun. 21, 2021, Huntington et al.
U.S. Appl. No. 17/352,937, filed Jun. 21, 2021, Cadugan et al.
U.S. Appl. No. 17/376,607, filed Jul. 15, 2021, Stewart et al.
U.S. Appl. No. 17/400,300, filed Aug. 12, 2021, Myers et al.
U.S. Appl. No. 17/402,065, filed Aug. 13, 2021, Lee et al.
U.S. Appl. No. 18/152,994, filed Jan. 11, 2023, Taylor et al.
U.S. Notice of Allowance dated Oct. 5, 2022 for U.S. Appl. No. 17/197,328; 9 pages.

* cited by examiner

DETERMINING A TEMPERATURE OF A PIXEL ARRAY BY MEASURING VOLTAGE OF A PIXEL

BACKGROUND

As is known in the art, photodetector arrays can be used to detect photons in a wide range of applications. Conventional detector array accuracy may be impacted by temperature changes. Some known detector arrays include a discrete temperature sensor placed on the same substrate as the detector. Other known arrays use the temperature of the read out integrated circuit (ROIC). These techniques may have less than optimal accurate temperature sensing.

SUMMARY

Embodiments of the disclosure provide methods and apparatus for sensing the temperature of a photodetector or photodetector array. In example embodiments, a photodetector comprises an array of photodiodes The resulting temperature indication is then used by circuitry integral to, or in addition to, circuitry used to determine the photonic response.

In embodiments, a detector array includes using aggregate dark current that can be DC coupled to eliminate photonic transient events and has a known temperature coefficient. The aggregate dark current can be sensed as the average output current of the photodetector bias power supply.

In some embodiments, one or more photodiodes can be used for sensing temperature information. Photodiodes can comprise vertical junctions, front- or backside-illuminated, for example, either forward or reverse biased, and/or covered with an opaque material to remove undesired photonic response. The forward or reverse voltage and/or reverse current can be used as an indicator of temperature(s). Circuits can be implemented in a silicon-based (Group IV) photodetector or array and/or III-IV materials, e.g., InGaAs, InP, etc.

In some embodiments, a photolithographic process can be used during fabrication of a photodiode or photodiode array for creating one or more lateral junctions with a selected structure and composition that can be forward or reverse biased. The forward or reverse voltage and/or reverse current can be used as an indicator of temperature. The obtained temperature can be used in example embodiments to enhance accuracy of a detector array.

In embodiments, the collected temperature information can be processed in a readout integrated circuit (ROTC). In some embodiments, analog temperature signal information can be converted into a digital indication of temperature (analog-to-digital conversion). The digital temperature information can be linearized, such as with a lookup table or arithmetic post-processing. In some embodiments, digital and/or analog temperature information can be transmitted as a buffered output (e.g., DAC, push-pull output, etc.). In embodiments, the temperature information can be compared to one or more threshold values.

In some embodiments, the photodetector bias voltage can be adjusted as a function of temperature. The temperature information can be used as a feedback signal in a temperature control loop for controlling a temperature-stabilizing mechanism, such as a thermoelectric cooler (TEC). The temperature information can be compared against one or more threshold values indicating the temperature limits beyond which the detector may be out of specification or have reduced performance. The temperature information can be compared against one or more threshold values indicating the temperature limits beyond which the detector may be out of specification or have reduced performance, indicating a potential functional safety fault, such as in an ISO 26262-compliant automotive application.

In one aspect, a method comprises: reverse biasing a first pixel in a pixel array; forward biasing a second pixel in the pixel array; measuring a voltage for the second pixel; and determining a temperature of the pixel array from the measured voltage for the second pixel.

A method can further include one or more of the following features: the first and second pixels are coupled to a reverse bias voltage source, the second pixel, and not the first pixel, are coupled to a forward bias voltage source that has a higher voltage than the reverse bias voltage source, determining the voltage for the second pixel includes measuring a voltage at a point between the forward bias voltage source and the second pixel, the second pixel comprises a photodiode and measuring the voltage comprises measuring the voltage at an anode of the photodiode, the first and second pixels are contained in a pixel layer, and wherein an oxide layer is above the pixel layer, a material above the second pixel to block photons from the second pixel, the material comprises metal, the material blocks a selected frequency bandwidth, and/or the material is wider than the second pixel.

In another aspect, a system comprises: a first pixel in a pixel array, wherein the first pixel is reverse-biased; a second pixel in the pixel array, wherein the second pixel is forward-biased; a first circuit to measure a voltage for the second pixel; and a second circuit to determine a temperature of the pixel array from the measured voltage for the second pixel.

A system can further include one or more of the following features: the first and second pixels are coupled to a reverse bias voltage source, the second pixel, and not the first pixel, are coupled to a forward bias voltage source that has a higher voltage than the reverse bias voltage source, determining the voltage for the second pixel includes measuring a voltage at a point between the forward bias voltage source and the second pixel, the second pixel comprises a photodiode and measuring the voltage comprises measuring the voltage at an anode of the photodiode, the first and second pixels are contained in a pixel layer, and wherein an oxide layer is above the pixel layer, a material above the second pixel to block photons from the second pixel, the material comprises metal, the material blocks a selected frequency bandwidth, and/or the material is wider than the second pixel.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
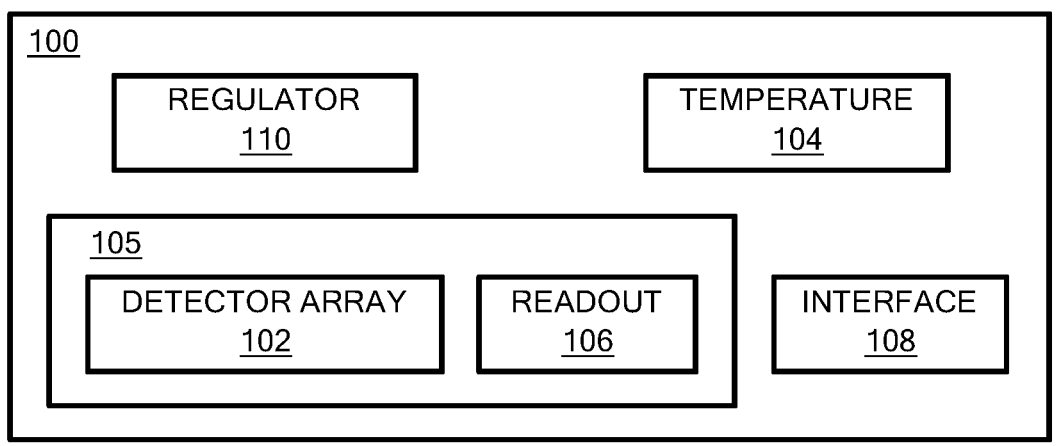
FIG. 1 is a block diagram of an example detector system including photodetectors having temperature sensing.

Prior to describing example embodiments of the disclosure some information is provided. Laser ranging systems can include laser radar (ladar), light-detection and ranging (lidar), and rangefinding systems, which are generic terms for the same class of instrument that uses light to measure the distance to objects in a scene. This concept is similar to radar, except optical signals are used instead of radio waves. Similar to radar, a laser ranging and imaging system emits an optical signal, e.g., a pulse or continuous optical signal, toward a particular location and measures the return echoes to extract the range.

Laser ranging systems generally work by emitting a laser pulse and recording the time it takes for the laser pulse to travel to a target, reflect, and return to a photoreceiver. The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam across a target area to measure the distance to multiple points across the field of view, producing a full three-dimensional range profile of the surroundings. More advanced flash lidar cameras, for example, contain an array of detector elements, each able to record the time of flight to objects in their field of view.

When using light pulses to create images, the emitted pulse may intercept multiple objects, at different orientations, as the pulse traverses a 3D volume of space. The echoed laser-pulse waveform contains a temporal and amplitude imprint of the scene. By sampling the light echoes, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images. In a discrete-return system, each recorded return corresponds, in principle, to an individual laser reflection (i.e., an echo from one particular reflecting surface, for example, a vehicle, a person, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angles of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar," "scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the return laser pulses, these instruments obtain a 3D data set (e.g., angle, angle, range)$_n$, where the index n is used to reflect that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set [e.g., angle, angle, (range-intensity)$_n$] is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar systems can include different types of lasers, including those operating at different wavelengths, including those that are not visible (e.g., those operating at a wavelength of 840 nm or 905 nm), and in the near-infrared (e.g., those operating at a wavelength of 1064 nm or 1550 nm), and the thermal infrared including those operating at wavelengths known as the "eyesafe" spectral region (i.e., generally those operating at a wavelength beyond about 1300-nm), where ocular damage is less likely to occur. Lidar transmitters are generally invisible to the human eye. However, when the wavelength of the laser is close to the range of sensitivity of the human eye—roughly 350 nm to 730 nm—the energy of the laser pulse and/or the average power of the laser must be lowered such that the laser operates at a wavelength to which the human eye is not sensitive. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors must be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those objects that are not diffusively-scattering objects), the collimated laser beams can be directly reflected back, largely unattenuated. This means that—if the laser pulse is transmitted, then reflected from a target 1 meter away—it is possible that the full energy (J) from the laser pulse will be reflected into the photoreceiver; but—if the laser pulse is transmitted, then reflected from a target 333 meters away—it is possible that the return will have a pulse with energy approximately $10^{12}$ weaker than the transmitted energy.

In many cases of lidar systems highly-sensitive photoreceivers are used to increase the system sensitivity to reduce the amount of laser pulse energy that is needed to reach poorly reflective targets at the longest distances required, and to maintain eyesafe operation. Some variants of these detectors include those that incorporate photodiodes, and/or offer gain, such as avalanche photodiodes (APDs) or single-photon avalanche detectors (SPADs). These variants can be configured as single-element detectors, -segmented-detectors, linear detector arrays, or area detector arrays. Using highly sensitive detectors such as APDs or SPADs reduces the amount of laser pulse energy required for long-distance ranging to poorly reflective targets. The technological challenge of these photodetectors is that they must also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy reduces the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—requires emitting 120,000 pulses [(20*10*60*10)=120,000)]. When update rates of 30 frames per second are required, such as is required for automotive lidar, roughly 3.6 million pulses per second must be generated and their returns captured.

There are many ways to combine and configure the elements of the lidar system—including considerations for the laser pulse energy, beam divergence, detector array size and array format (single element, linear, 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example—compared to the 3D lidar above—to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eyesafe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a from a closer-by object can be recorded, as well as the range and intensity of later reflection(s) of that pulse—one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example avalanche photodiodes (APDs), which along with their CMOS amplification circuits allow poorly-reflective targets to be detected, provided the photoreceiver components are optimized for high conversion gain. Largely because of their high sensitivity, these detectors may be damaged by very intense laser pulse returns.

However, capturing the intensity of pulses over a larger dynamic range associated with laser ranging may be challenging because the signals are too large to capture directly. One can infer the intensity by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

FIG. 1 shows an example detector system 100 including a photodetector array 102 for which a temperature sensing module 104 can sense temperature information. The detector array 102, which can comprise a focal plane array (FPA) 105 having an array of pixels, is coupled to a readout module 106, such as a readout integrated circuit (ROIC). Although the FPA 105 is shown as a ROIC and detector array, in another embodiment they may comprise one piece of material, for example a silicon FPA. In addition, the readout module 106 may comprise a silicon circuit and the detector array 102 may comprise a different material, such as, but not limited to GaAs, InGaAs, InGaAsP, and/or other detector materials.

In embodiments, the detector array 102 can comprise pixels in one dimension (1D), two dimensions (2D), and/or three dimensions (3D). An interface module 108 can output the information from the readout module 108. The detector system 100 can comprise an integrated circuit (IC) package having external I/O including array outputs and temperature alert signals. The detector system 100 can include a regulator 110 to provide one or more regulated voltages for the system.

Figure 2:
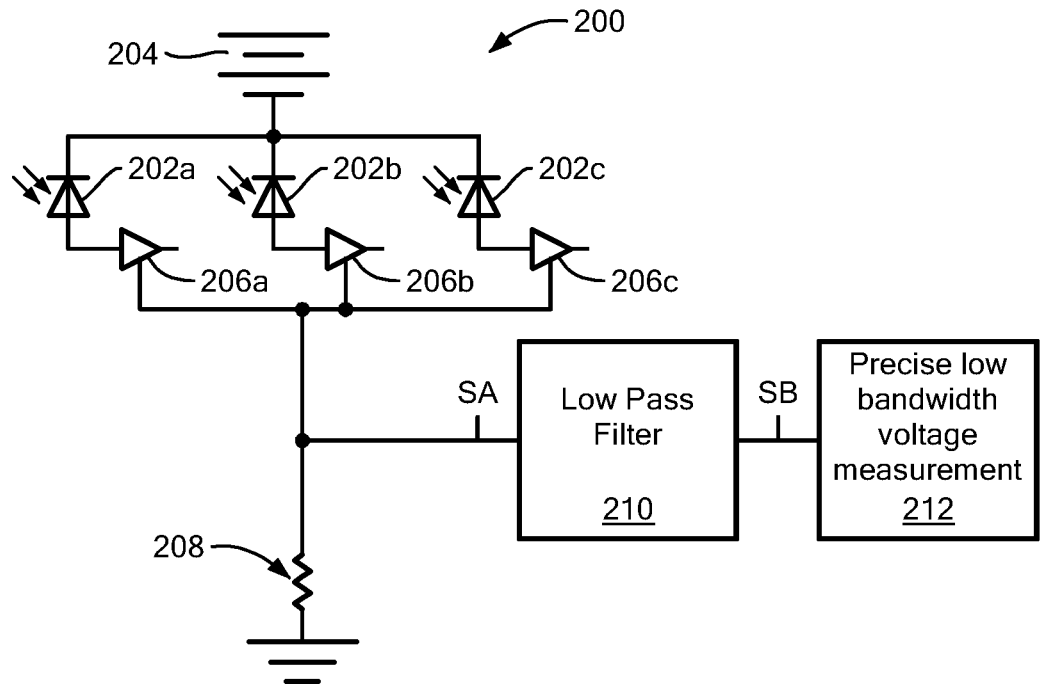
FIG. 2 is an example circuit implementation for sensing temperature in a part of a detector system.

FIG. 2 shows an example circuit implementation 200 of a portion of a detector array and temperature module. The aggregate dark current, e.g., bias current assuming no photonic input) from the array, for a subset of the array or a single pixel, can be used to obtain temperature information. A typical dark current of an InGaAs APD (Avalanche PhotoDiode) photodetector, for example, is about 2.5 pA per square μm assuming a typical reverse bias used to operate as an APD, with a temperate coefficient of about 3% per degree C. Other types of photodetectors, APD, PIN (Ptype Insulator Ntype, non-multiplying photodetector) or SPAD (Single Photon Avalanche photodiode) can be used in a similar manner. For a typically sized single pixel this would be about 80 nA and for an array in the order of about 128×128 elements could be about 45 uA. This value may vary directly based on photonic input of the system as the APD will increase its output current under such events. As in a typical receiver with a pulsed laser stimulus, the amount of time that a photodetector sees a real photonic input is generally less than 0.1% of the time. In the dead time between the pulses a DC coupled value can be extracted and accurately measured. As what would be a typical temperature coefficient of about 5% linearly per degree C. is relatively significant, the signal should be extracted over time. In an array context, by averaging, for example, a stable and accurate temperature can be extracted in the readout IC (ROIC) or other circuitry. In addition, this current should be readily accessible to measure in the ROIC as the aggregate of one end of a Trans-Impedance Amplifier (TIA), for example, that can be used to convert the photocurrent from each diode into a voltage for use in understanding the amount of photonic stimulus seen by the photodetector.

In the illustrated embodiment, a series of photodetectors 202a,b,c, such as photodiodes, are coupled to a common bias voltage 204 at one terminal and respective amplifiers 206a,b,c at the other terminal. It is understood that the common bias voltage 204 can be coupled to any practical number of photodiodes. The amplifiers 206 provide a respective output signal for each of the photodiodes 202a, b,c. In embodiments, the amplifiers 206 can be coupled to ground via an optional sense resistor 208, which may comprise a precision temperature stabilized resistor.

Figure 2A:
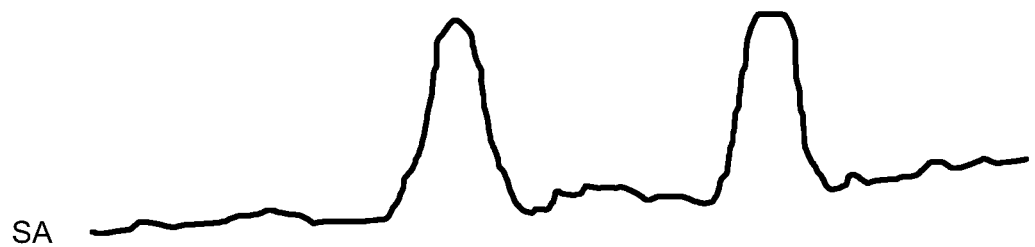
FIG. 2A is an example waveform generated by the circuit of FIG. 2.
Figure 2B:
FIG. 2B is an example waveform generated by the circuit of FIG. 2.

A voltage SA on the sense resistor 208 can be provided an input to a low pass filter 210 the output SB of which can be an input to a low bandwidth voltage measurement device 212. FIG. 2A shows an example signal SA at the input of the low pass filter 210. As can be seen, the signal SA can include pulses 220 that can be filtered by the low pass filter 210. The filtered signal SB is shown in FIG. 2B as the input to the voltage measurement device 212. The voltage measurement device 212 can output a voltage measurement that can be used to determine a temperature of the array.

The filtered signal SA represents dark current for the detector array. As used herein, dark current refers to a current generated by the array when not receiving target photonic energy. The array dark current can be used to calibrate and obtain temperature information for the array photodetectors.

In example arrays, dark current can change as a function of $e^{0.05\, T}$, where T is in Kelvin for ambient room temperature. This translates to about 5% per degree. By analyzing the dark current over time, temperature information can be obtained for the array. This information can be translated by use of a look-up table, or more complex mathematical algorithm to determined implied temperature.

Figure 3:
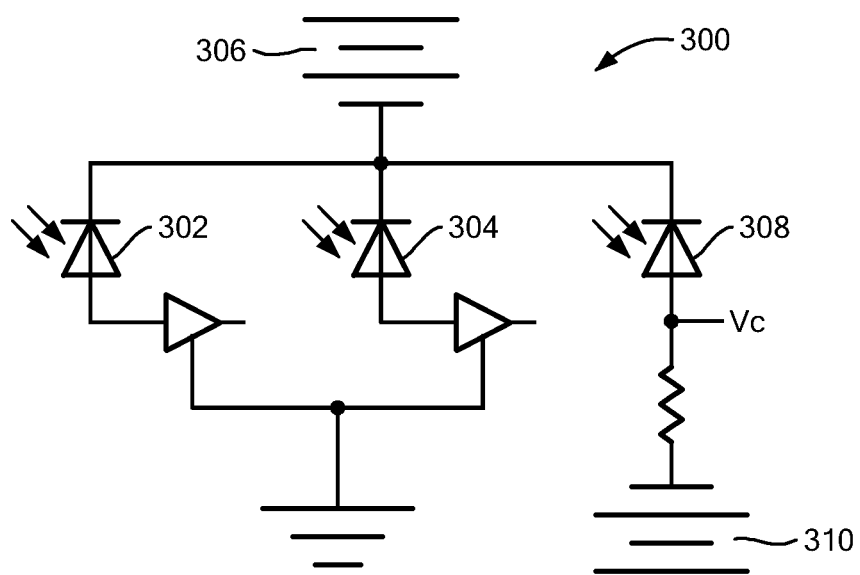
FIG. 3 is an example circuit implementation for sensing temperature in a part of a detector system.

FIG. 3 shows an example circuit 300 which can form a part of a detector system. One or more individual photodetectors within an array, a redundant photodetector, or the like can be selected to extract the temperature of the array. In one embodiment, a diode is reverse biased and may be covered with an opaque surface to avoid photonic input and/or be DC coupled. In another embodiment, a diode in the array may be forward biased through a separate bias delivered by a ROIC or other circuitry. In this instance the diode should not be completely responsive to regular photo-stimulus as the Avalanche effect will not be occurring due to the lack of near breakdown reverse bias. The forward biased voltage drop can be measured and the resultant extracted temperature is an accurate representation of the temperature of the array.

An example circuit 300 implementation includes first and second pixels having respective first and second photodiodes 302, 304 biased in a reverse direction by bias voltage source 306. As will be appreciated by one skilled in the art, reverse biasing is 'normal' for a photodetector or Avalanche diode. A third pixel has a forward biased photodiode 308 coupled between the reverse bias voltage source 306 and a forward bias voltage source 310, which has a higher voltage than the reverse bias voltage source 306.

In embodiments, a voltage Vc at the anode of the third photodiode 308 can be measured to determine the current, potentially through the use of a known sense resistor to have a resultant voltage below the voltage source 310 which corresponds to temperature.

Figure 4:
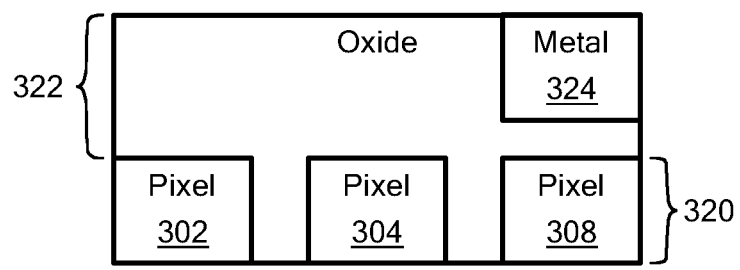
FIG. 4 is a schematic representation of an example pixel implementation for the circuit of FIG. 3.

FIG. 4 shows an example pixel array configuration for the first, second, and third photodiodes 302, 304, 308. In the illustrated embodiment, a pixel layer 320 is covered by an oxide layer 322. An optional opaque material 324 can cover the third pixel 308 to prevent photons from reaching the third pixel 308 so that no photonic response is generated. In some embodiments, the opaque material 324 prevents a particular bandwidth of energy from passing through. It is understood that the opaque material 324 can comprise any suitable material, such as metal.

By eliminating a photonic response by the third pixel 308, which is proximate the first and second pixels 302, 304, any change in the measured current Vc is due to a change in temperature. Thus, the measured current can be used to determine a temperature of the array.

Figure 5:
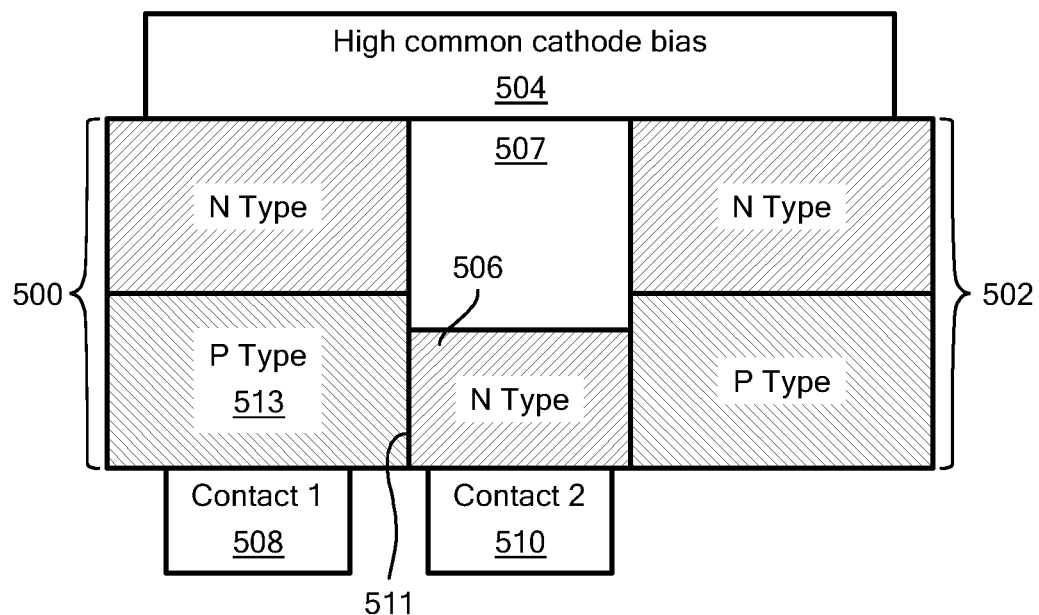
FIG. 5 is a schematic representation of an example PN junction configuration from which temperature information can be extracted.

FIG. 5 shows an example lateral junction using an existing photodiode and the gap between it and an adjacent photodiode with an additional doping near the bottom of the vertical structure where the bias voltage is already quite low. By biasing this lateral junction in a forward manner the temperature of an array can be extracted based on the temperature dependence of the lateral junction.

In the illustrated embodiment, first and second PN junctions 500, 502 are reverse biased by a common bias voltage 504. The first and second PN junctions are separated by an N type material 506. Intrinsic material 507, for example, can be provided between the N type material of the first and second PN junctions 500, 502. A path from a first contact 508 to a second contact 510 goes through the reverse biased first PN junction. A forward biased junction 511 is provided at the interface of the N type material 506 and the P-Type material 513 of first PN junction. By measuring the current flowing between the first and second contacts 508, 510, one can extract the temperature of the array using the temperature dependence of the first junction 500. Extracting temperature by sensing the change in the forward biased junction voltage drop is a technique well known in the art for using a diode as a temperature sensor.

In embodiments, a current is measured that corresponds to temperature. In embodiments, a measured current is converted to voltage for comparison against one or more thresholds, example. In some embodiments, lookup tables can be used to covert current and/or voltage to temperature for a given array or array element.

It is understood that the PN junctions can form an array of pixels, as described above.

Figure 5A:
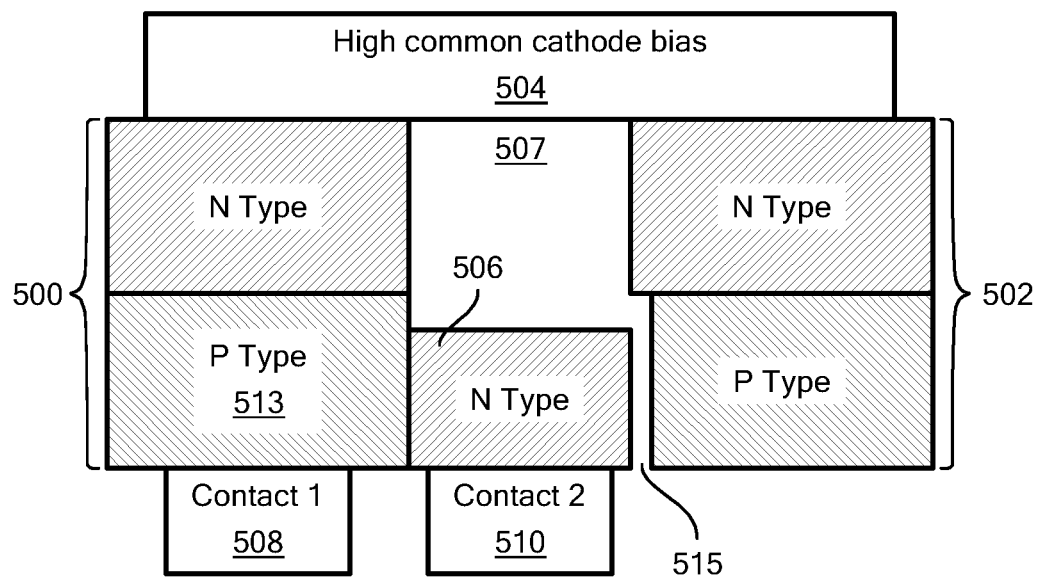
FIG. 5A is a schematic representation of another example PN junction configuration from which temperature information can be extracted.

FIG. 5A shows alternative embodiment of the configuration of FIG. 5 wherein like reference numbers indicate like elements. First and second PN junctions 500, 502 are reverse biased by a common bias voltage 504. The first and second PN junctions 500, 502 can be considered as vertical junctions. The first and second PN junctions are separated by an N type material 506. A path from a first contact 508 to a second contact 510 goes through the reverse biased first PN junction. A forward biased junction 511 is provided at the interface of the N type material 506 and the P-Type material 513 of first PN junction. The junction 511 can be considered a lateral junction. A gap 515 can be provided between the N type material 506 of the first PN junction and the P type material 517 of the second PN junction 502. In other embodiments, the gap 515 can comprise an insulative material.

It should be noted that when the forward biased junction is used to detect temperature, it is the change in the voltage drop across the junction that is significant. When it is a reverse bias junction, it is the current that is significant.

Figure 6:
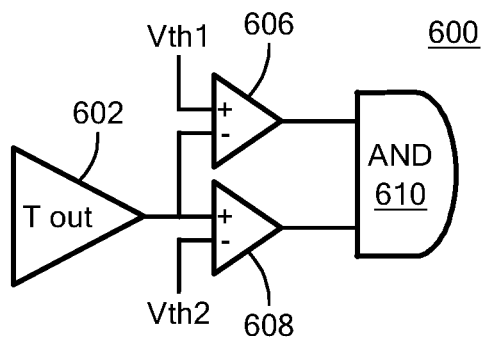
FIG. 6 is an example circuit implementation of sensing temperature using voltage threshold comparisons.

FIG. 6 shows a portion of a temperature sensing system that can form a part of a laser pulse detection system, for example. It is understood that a detector system 600 can comprise a single pixel or any number or practical pixels. In the illustrated embodiment, a transimpedance amplifier (TIA) 302 receives a measured current, as described above, and generates an output 304 that is coupled to inputs of first and second comparators 606, 608. A first voltage threshold Vth1 is coupled to a second input of the first comparator 606 and a second voltage threshold Vth2 is coupled to a second input of the second comparator 608. The outputs of the first and second comparators 606, 608 are provided as inputs to an AND gate 610, which changes state when the output of the amplifier 602 is between the first and second voltage thresholds Vth1, Vth2. The output signal of the AND gate 610 can be utilized to inform the system whether the photodetector is operating at a temperature that would allow for reliable operation. If it is outside of this range, then the system may shut down the system to avoid possible damage or inaccurate information.

It is understood that a variety of thresholds and Boolean logic configurations can be used to process the amplifier and/or comparator outputs to meet the needs of a particular application.

Figure 7:
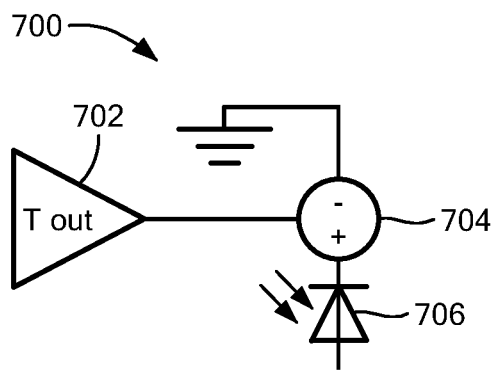
FIG. 7 is an example circuit implementation of adjusting detector bias based on temperature information.

FIG. 7 shows an example circuit 700 for changing the photodetector bias voltage as a function of temperature. An amplifier 702 receives a temperature-dependent current measurement, as described above, and generates a voltage output corresponding to the current level. The amplifier 702 output is coupled to a bias voltage source 704 for at least one photodiode 706. The bias voltage source 704 changes based upon the temperature. By changing the bias of the photodiode, it is possible to compensate for variations in the sensitivity of the photodiode by, for example keeping the output gain to be constant, ensuring that the output response is the same for the same photonic input over its operating temperature range.

Figure 8:
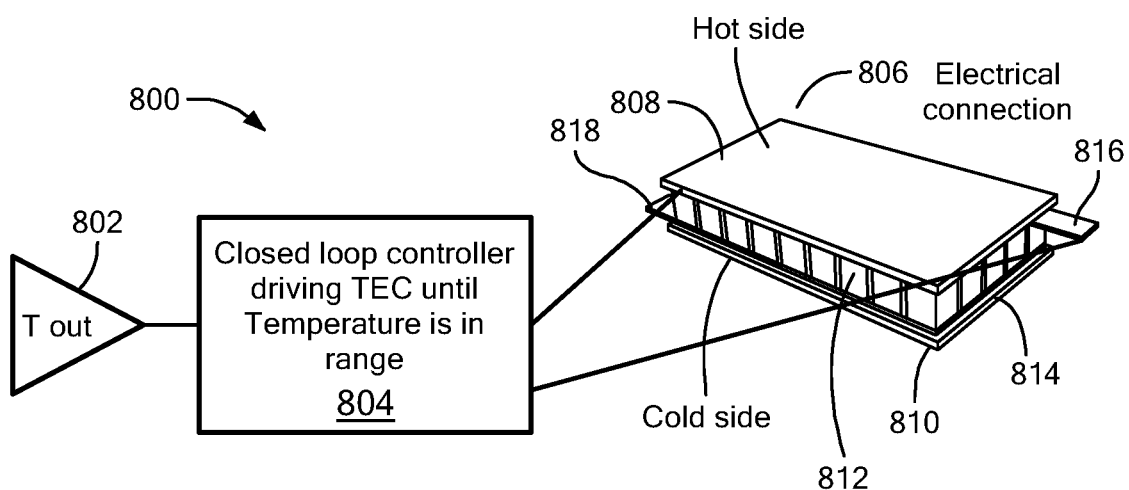
FIG. 8 is an example circuit implementation of a cooling system with temperature feedback.

FIG. 8 shows an example circuit 800 that responds to temperature changes. An amplifier 802, such as a TIA, receives a current measurement, as described above, and provides a temperature-dependent voltage signal to a controller module 804. In the illustrative embodiment, the controller 804 comprises a closed loop controller for driving a thermoelectric cooler (TEC) unit 806 until a given temperature range is attained. Here the temperature control acts as the sensor in a closed loop system, increasing the amount of work function of the TEC when the temperature goes out of range high and reducing this work function when the temperature drops too low.

In the illustrated embodiment, the TEC unit 806 has a hot side 808 and a cold side 810 separated by a layer 812 of NP junctions disposed on an interconnect layer 814. First and second electrical connections 816, 818 can be coupled to the controller 804. One or more measured currents from the TEC unit 806 can be provided as feedback signals to the amplifier 802 for controlling the temperature of the TEC unit.

Figure 9:
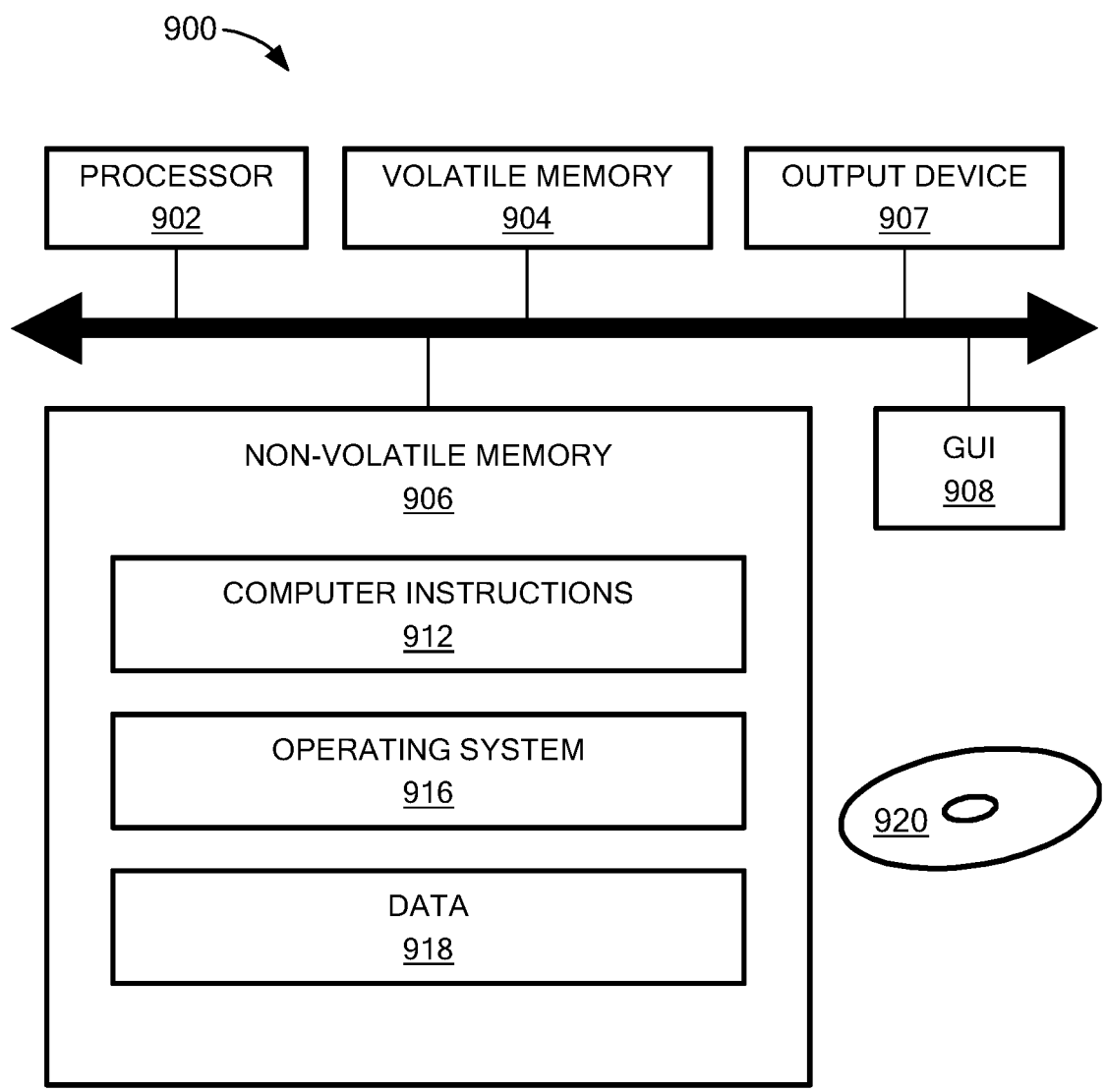
FIG. 9 is a schematic representation of an example computer that can perform at least a portion of the processing described herein.

FIG. 9 shows an exemplary computer 900 or controller that can perform at least part of the processing described herein. For example, the computer 900 can perform processing of temperature information, as described above. The computer 900 includes a processor 902, a volatile memory 904, a non-volatile memory 906 (e.g., hard disk, or other memory such as FLASH, EEPROM, or RAM), an output device 907 and a voice control unit, and/or a graphical user interface (GUI) 908 (e.g., a mouse, a keyboard, a display, for example). The non-volatile memory 906 stores computer instructions 912, an operating system 916 and data 918. In one example, the computer instructions 912 are executed by the processor 902 out of volatile memory 904. In one embodiment, an article 920 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, including FLASH memory, or EEPROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    reverse biasing a first pixel in a pixel array;
    forward biasing a second pixel in the pixel array, wherein the first and second pixels are photosensitive, wherein the first and second pixels have a common cathode;
    measuring a voltage for the second pixel; and
    determining a temperature of the pixel array from the measured voltage for the second pixel,
    wherein the first and second pixels are coupled to a reverse bias voltage source at the common cathode, and wherein the second pixel, and not the first pixel, is coupled to a forward bias voltage source that has a higher voltage than the reverse bias voltage source to forward bias the second pixel.

2. The method according to claim 1, wherein determining the voltage for the second pixel includes measuring a voltage at a point between the forward bias voltage source and the second pixel.

3. The method according to claim 2, wherein the second pixel comprises a photodiode and measuring the voltage comprises measuring the voltage at an anode of the photodiode.

4. The method according to claim 1, wherein the first and second pixels are contained in a pixel layer, and wherein an oxide layer is above the pixel layer.

5. The method according to claim 4, further including a material above the second pixel to block photons from the second pixel.

6. The method according to claim 5, wherein the material comprises metal.

7. The method according to claim 5, wherein the material blocks a selected frequency bandwidth.

8. The method according to claim 5, wherein the material is wider than the second pixel.

9. A system, comprising:
    a first pixel in a pixel array, wherein the first pixel is reverse-biased;
    a second pixel in the pixel array, wherein the second pixel is forward-biased, wherein the first and second pixels are photosensitive, wherein the first and second pixels have common cathode;
    a first circuit to measure a voltage for the second pixel; and
    a second circuit to determine a temperature of the pixel array from the measured voltage for the second pixel,
    wherein the first and second pixels are coupled to a reverse bias voltage source at the common cathode, and wherein the second pixel, and not the first pixel, is coupled to a forward bias voltage source that has a higher voltage than the reverse bias voltage source to forward bias the second pixel.

10. The system according to claim 9, wherein determining the voltage for the second pixel includes measuring a voltage at a point between the forward bias voltage source and the second pixel.

11. The system according to claim 10, wherein the second pixel comprises a photodiode and measuring the voltage comprises measuring the voltage at an anode of the photodiode.

12. The system according to claim 9, wherein the first and second pixels are contained in a pixel layer, and wherein an oxide layer is above the pixel layer.

13. The system according to claim 12, further including a material above the second pixel to block photons from the second pixel.

14. The system according to claim 13, wherein the material comprises metal.

15. The system according to claim 13, wherein the material blocks a selected frequency bandwidth.

16. The system according to claim 13, wherein the material is wider than the second pixel.

* * * * *